United States Patent [19]

Solow

[11] 4,306,217

[45] Dec. 15, 1981

[54] FLAT ELECTRICAL COMPONENTS

[75] Inventor: Benjamin Solow, North Hollywood, Calif.

[73] Assignee: Angstrohm Precision, Inc., Hagerstown, Md.

[21] Appl. No.: 53,440

[22] Filed: Jun. 29, 1979

Related U.S. Application Data

[63] Continuation-in-part of Ser. No. 803,291, Jun. 3, 1977, Pat. No. 4,176,445.

[51] Int. Cl.³ .......................................... H01C 1/034
[52] U.S. Cl. .................................... 338/275; 29/613; 338/195; 338/308; 338/329
[58] Field of Search .................. 338/275, 195, 7, 308, 338/274, 329; 29/620, 619, 621, 613; 174/52 PE

[56] References Cited

U.S. PATENT DOCUMENTS

| | | | |
|---|---|---|---|
| 1,418,633 | 6/1922 | Egly | 29/621 X |
| 2,489,409 | 11/1949 | Green et al. | 338/275 |
| 2,683,767 | 7/1954 | Cunningham | 174/52 PE |
| 2,693,023 | 11/1954 | Kerridge et al. | 338/195 X |
| 2,883,502 | 4/1959 | Rudner | 29/620 |
| 3,048,914 | 8/1962 | Kohring | 29/613 |
| 3,222,450 | 12/1965 | Lee et al. | 174/52 PE |
| 3,238,490 | 3/1966 | Thomson | 29/619 X |
| 3,405,381 | 10/1968 | Zandman et al. | 338/275 X |
| 3,778,744 | 12/1973 | Brandi | 338/275 X |
| 3,947,801 | 3/1976 | Bube | 338/195 X |
| 4,016,527 | 4/1977 | Francis et al. | 29/619 X |

Primary Examiner—C. L. Albritton
Attorney, Agent, or Firm—Fisher, Christen & Sabol

[57] ABSTRACT

Substantially flat thin foil electrical components, e.g. thin foil resistors, are disclosed wherein a thin metallic foil is bonded to an insulating substrate and a circuit path is formed on the foil by photographic artwork-etching or other techniques. Terminal lands of the circuit are electroplated on the foil connecting leads having paddles or flattened portions formed with a hole or slot therein are soldered to the lands such that the solder extends into the hole or slot. The value of the resistor is finally adjusted by use of a laser beam, at least one bead of rubber is applied on at least a portion of the edges of the substrates, and the resistor is encapsulated.

10 Claims, 7 Drawing Figures

FLAT ELECTRICAL COMPONENTS

RELATED APPLICATION

This application is a continuation-in-part application of my earlier application Ser. No. 803,291, filed June 3, 1977, now U.S. Pat. No. 4,176,445.

FIELD OF THE INVENTION

This invention relates to generally flat electrical componenets, such as, metal foil resistors, thick film resistors, other flat resistors, flat capacitors, micro circuit chips and the like and more specifically to methods of making such devices.

DESCRIPTION OF THE PRIOR ART

Generally flat electrical components, e.g., metal foil resistors, per se, as well as methods of making same are well known in the art. Generally speaking, these components comprise an insulating substrate (usually of glass or ceramic material); a thin metallic foil bonded to the substrate, the foil having a circuit path thereon usually formed by photographic-acid etch or other similar techniques; connector leads attached to the thin foil at predetermined points in the circuit path; and a protective coating surrounding the entire structure.

Typically the photographic-acid etch technique of forming the circuit path comprises the steps of photographing the desired circuit path and reducing the artwork in size to correspond to the desired size of the final component; coating the thin metal foil with a photosensitive masking medium; exposing the coated side of the foil to the photographed circuit; and, subjecting the exposed foil to an etching process wherein all foil not corresponding to the desired circuit is removed. The etching process may be undertaken either before or after the foil has been bonded to the substrate.

Resistors formed by methods analogous to the aforedescribed processes are exhibited by the following U.S. Patents:

| | | |
|---|---|---|
| 2,899,658 | Bean | August 11,1959 |
| 3,071,749 | Starn | January 1, 1963 |
| 3,405,381 | Zandman et al | October 8, 1968 |
| 3,517,436 | Zandman et al | June 30,1970 |

Despite the general acceptance of this basic method by the electronics industry, the resistors formed thereby have exhibited several deficiencies. Among the more prominent problems has been the use of a welding process to attach the connector leads to the terminals of the foil circuit path. Due to the small size of the terminals and the thinness of the circuit foil (on the order of 0.0001") the welds attaching the relatively thick connector leads to the circuit terminals have exhibited very poor strength. Normal usage often causes a breakage in the welds and, consequently, a catastrophic failure in the resistor due to the open circuit.

In addition, prior leads that are soldered to the foil tend to peel when bent and are relatively weak during factory handling before molding and are in need of improvement. Prior soldered leads are also weakened by thermal expansion and contraction due to the differences of thermal expansion coefficients of the substrate and the lead material. Prior solder joints also tend to become relatively brittle and some break easily after long exposure to high temperatures, e.g., 90 hours at 190° C. This is believed to be due to the migration or diffusion of gold (electroplated on the lands of the foil circuit path to form a good solder joint) into the solder induced by the long high temperature exposure. The more gold that migrates into the solder, the less the strength. While this phenomenon has no apparent effect on the strength and performance of the finished product after encapsulation, it limits the duration and temperature of baking in the manufacturing process before encapsulation without losing some leads.

Moreover, prior metal foil resistors were subject to variations in resistance values during manufacturing steps, such as, the encapsulation step, following final adjustment of the resistance value. In many cases, these variations were not controllable or readily predictable and the resulting resistors, although intended to be of essentially the same resistance value, were characterized by resistance values that differed from resistor to resistor and differed from the desired value. These variations in resistance values are believed to be due to compressive stresses fortuitously imparted to the metal foil during encapsulation and/or other manufacturing steps following final resistance adjustment.

A typical foil circuit has a serpentine current path defined by a series of closely spaced foil "legs". The value of the resistance may be adjusted, to overcome inaccuracies inherent in the manufacturing process, by cutting through specifically designated portions of the circuit to alter the path of current travel. This method of adjustment requires a number of circuit portions for fine adjustment, since the adjustment must be made in discrete steps.

In the prior art resistors, the required adjustment causes serious deficiencies, notably the extremely fine lines used to adjust circuit patterns by the scratch and break method are often much finer than the basic pattern and are, therefore, sensitive to the tiniest defects during manufacture. Obviously, this decreases the reliability of the resistor.

Also, in the prior art methods of adjusting by cutting through the foil to alter the current path, it is necessary to carry out the adjustment manually, usually by an operator with the aid of a microscope. The manual adjustment necessitates a large amount of time in the production process and results in a higher priced product which is subject to human error.

Many prior art resistors devote a portion of the foil area to a trimmer circuit pattern, i.e., a pattern used solely in the adjusting operation to adjust the value of the resistor. This portion serves no other purpose than adjustment, and results in a resistor somewhat larger in size than is absolutely necessary.

The standard adjustment technique of cutting the foil to the current flow path also contributes to unnecessary size since, usually, a number of conductor lines do not carry any current. In this age of miniaturization, it is a serious product deficiency to have unused or partially used space which results in a resistor larger than necessary.

SUMMARY OF THE INVENTION

The present invention relates to flat electrical components that utilize a thin metal foil or film which defines a current path or electrical circuit. While the invention is described hereinafter with specific reference to thin metal foil resistors, it is applicable also to thick film resistors, other flat resistors and capacitors, and micro circuit chips. The invention is especially useful in providing flat electrical components of high precision.

An important improvement of this invention is the application (before encapsulation or molding) of a bead of rubber along at least one edge or edge portion of the substrate of the electrical component to reduce or eliminate stress-induced changes in the electrical characteristics, e.g., resistance value, of the metal circuit or current path bonded to the substrate. Preferably, the rubber bead is applied to that edge or edge portion of the substrate that is transverse to the direction of the stress the effects of which it is desired to reduced. If desired, the bead can be applied around the entire periphery of the substrate or along two intersecting edges of a rectangular component, for example. The bead has the effect, for example, of reducing the offset of metal foil resistors to less than one quarter of the offset without the bead.

Another important aspect of this invention is the use of electrical leads that have a flat portion or paddle formed with a hole or slot in it. The paddle is soldered to the land of the metal foil circuit of the component and the hole or slot provides considerable advantages in strength of the solder joint and overall lead strength. This improvement not only provides a better final product but also reduces the number of rejects due to the breaking of lead joints during factory handling before and during encapsulation or molding. This improvement permits the lead to be bent without peeling the solder joint and reduces the stiffness of the lead at the paddle. It also permits a stronger solder joint since the solder in the hole or slot provides a large shear area compared to the tension area between the paddle without the hole or slot and the land. Also, the hole or slot allows the paddle to expand or contract more with changes in temperature. As a result, breakage that might occur due to a large difference in thermal expansion coefficient of the substrate and the paddle is reduced.

It has also been noticed that solder joints heretofore tended to become relatively brittle and some broke easily after long exposure to high temperature, e.g., 90 hours at 190° C. The migration or diffusion of gold into the solder joint after long exposure to high temperatures is believed to underly the drop in strength; the more gold, the less strength. While this does not appear to affect the strength or performance of the final product after encapsulation, it limits the baking procedures available during manufacture or else provides a higher number of rejects due to breakage during factory handling before encapsulation.

My earlier application discloses the method which comprises the steps of bonding an annealed thin metallic foil to an insulating substrate using an epoxy glue; coating the foil surface of the laminate with a photosensitive masking medium; exposing the coated surface to photographic artwork of the desired circuit pattern or patterns; etching away the metallic foil not required for the circuit; removing the masking medium; etching the thickness of the circuit pattern to roughly adjust the value of the resistor; recoating the circuit with a masking medium except for the terminal lands to which the connecting leads are to be attached; electroplating the terminal lands; removing the masking medium; soldering the connecting leads to the terminal lands; coating the resistor with varnish; laser adjusting the resistor to its final value; coating the resistor with rubber for strain relief; and encapsulating the completed resistor structure.

The application of the bead pursuant to this invention is performed prior to the encapsulation step and preferably after the laser adjusting step. The bead can be applied by means of a hypodermic needle, by a tiny brush, by touching the edge onto the uncured rubber or by any suitable means. The bead is cured by conventional means, at room temperature as with RTV rubbers or at higher temperatures when other materials are used. The bead can be made of any suitable soft or cushioning material which can absorb compressive stresses (e.g., such as those building up during encapsulation) to prevent or reduce their transmission to the substrate. The bead preferably is applied to the edge that runs transverse to the direction of the most troublesome stress. For example, if the circuit path is elongate the most troublesome stress would be in the direction of the longest dimension of the circuit path and a bead should be applied along an edge of the substrate that is transverse to said longest dimension. The bead can be applied along two intersecting edges of the substrate, or three or more or all edges of the substrate, if desired. It was unexpectedly found, however, that application of the bead along a single edge as described above is adequate and also saves space inside the encapsulating jacket. This improvement also avoids the need for multiple dipping in rubber in order to build-up a coating of suitable thickness.

By etching the thickness of the circuit pattern to achieve the rough adjustment of the resistance value, it is not necessary that the resistor have a separate portion of the circuit used only for value adjustment. Thus, a resistor formed by this method allows the maximum amount of the substrate area to be utilized for the actual resistor circuit. This allows a given value resistor to be smaller in size or, conversely, a larger circuit path to be incorporated onto a given substrate area. The coarse adjust may be carried out by automated methods, thereby eliminating the manual adjust required by prior art techniques.

The above-described method also eliminates the problem of poor strength welds previously used for attaching the connecting leads to the terminal lands by plating the lands and soldering the connecting leads thereto. The strength of the connection is improved since the solder holds over the entire area of the terminal lands, not just in one spot like the welds. Furthermore, the hole or slot in the paddle of the lead provide greater strength solder joints and permits the use of less gold in plating the lands.

DETAILED DESCRIPTION OF PREFERRED EMBODIMENT

Figure 1:
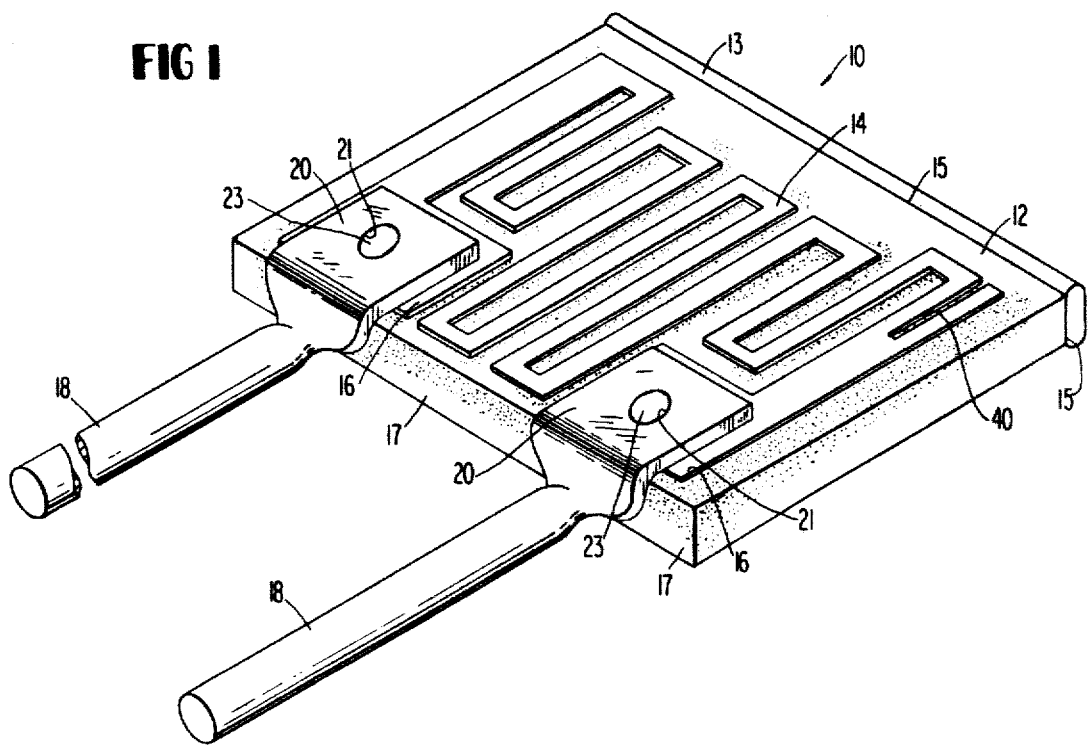
FIG. 1 is an enlarged perspective view of a resistor made according to the invention, with the coatings and encapsulation omitted for clarity.

A resistor made by the preferred embodiment of this invention is illustrated in FIG. 1 generally as 10 and comprises a substrate 12 of insulative material, such as glass or ceramic, a thin metallic foil resistor circuit pattern 14 with integral terminal lands 16, and connecting leads 18 having flattened portions or paddles 20 attached to the terminal lands 16 by soldering. The resistor as just described may be encapsulated by molding an insulating material around the entire structure after first coating with a varnish (such as Dow Corning G P 77 NP) and rubber or by potting in a case, as is well known in the art. The encapsulations and coatings are omitted from FIG. 1 for purposes of clarity. The individual resistor 10 is cut from a series of resistor patterns applied to a common substrate as described in my earlier application. These resistor patterns are formed by a thin metallic foil which has been bonded to the substrate by a laminating process to be described hereinafter, and subsequently subjected to a photographic artwork-etching process which removes all of the foil except that which forms the circuit patterns.

Prior to bonding to the substrate, the thin metallic foil is first annealed. The metal foil may be made from any resistive alloy, such as Evanohm alloy made by Wilbur B. Driver Co. and is on the order of 0.0001" thick. The foil is annealed by heating it in an inert atmosphere at 1000° F. for a sufficient time to provide a temperature coefficient of resistance of the completed resistor in combination with the particular substrate of approximately zero. The requisite time will, of course, vary with the particular alloy metal film being used, but for Evanohm metal foil, it has been found that heating the foil at 1000° F. for a period of approximately 15 minutes will produce the desired temperature coefficient of resistance when laminated to a Soda Lime glass substrate.

A thin layer of epoxy glue, on the order of 0.0002" thick, is applied to one surface of the substrate. A thick even layer may be applied by spinning the substrate about a central axis perpendicular to the plane of the substrate and applying a small drop of epoxy to the center of rotation. The centrifugal force generated by the spinning will spread the epoxy evenly over the substrate surface. Of course, any other method of applying the epoxy, which results in a thin, even layer, may also be used.

After the epoxy has been applied to the surface, the annealed thin metal foil is laminated to the substrate. The lamination is accomplished by placing the thin metal foil 22 in contact with the epoxy coated substrate surface 12 and placing on top of the foil, a sheet of Mylar, a layer of thin stainless steel, and, finally, a layer of rubber sheet. The rubber sheet may be silicone rubber approximately 1/16" thick. This entire assembly is placed in a vacuum press. The press is first closed to form a vacuum seal, without exerting any pressure on the laminate, and a vacuum of approximately 1 mm of Hg is maintained for one minute. The press is then closed fully to exert a pressure of approximately 1000 psi and the laminate is cured for 20 minutes at 335° F. in the press. The assembly is then removed from the press and further cured for 40 minutes at 350° F. in an oven. After the curing cycle is completed, the laminate is removed from the oven and the rubber, stainless steel, and Mylar sheets are removed, leaving the thin metal foil bonded to the substrate. Since the Mylar does not stick to the epoxy, no mold release is required. The stainless steel sheet prevents the stretching of Mylar sheet during compression, thereby preventing damage to metal foil 22.

The circuit pattern is formed on the foil by standard photographic artwork-etching techniques. As a practical matter, several patterns are formed on each substrate. It is not necessary to specifically delineate all the details of this process, as it is well known to those having reasonable skill in the art. Briefly, the desired circuit pattern or a plurality of such patterns are photographed and reduced to the desired size. The foil is coated with a photosensitive masking medium, such as Kodak KTFR, and exposed to the photographic circuit pattern. The KTFR is retained on the foil only on the desired circuit pattern. The foil and substrate are then subjected to an acid etching bath which removes all foil except that covered by the KTFR. The KTFR is removed, leaving only the thin metallic foil in the desired circuit pattern on the substrate. Although Kodak KTFR has been mentioned in the above description, any other suitable photo-resist material may also be used such as Hunt Sc, or Shipley AZIII or AZ 1350J. The acid bath may consist of hydrochloric acid, nitric acid and water or hydrochloric acid and stannous chloride.

All of the afore-mentioned operations have been carried out while the resistors are on a common substrate. At this point, the individual resistors are separated by diamond saw cutting or other standard, known techniques such as scribing and breaking.

The next step is to coarse adjust the resistor to its approximate value by subjecting it to another acid etching process to reduce the thickness of the foil pattern. This etching will adjust the resistor to ±1% or less of its final value. The etchant used to adjust the thickness may be the same used to form the pattern, but further diluted with water.

The etching adjustment process comprises the steps of spraying the etching solution onto the metal foil or placing the resistor in an etching tank for a predetermined period of time; removing the resistor from the etching tank and placing it into a rinse solution to rinse off the etchant; drying the resistor; and measuring its value. Prior to etching the thickness, the terminal lands may be coated with a photoresist material to prevent the etching adjust process from reducing their thickness.

The aforementioned etching adjustment process may be carried out by manually transferring the resistor from etching through measuring, but is ideally carried out by apparatus which automatically moves the resistor through the sequence of adjusting steps. One form of apparatus is shown in my earlier application mentioned hereinabove wherein tanks or troughs containing the etching solution and rinsing water, and drying and measuring apparatus are used. An extendable or slidable arm has means mounted thereon to grip a resistor, and is mounted on a vertically extensible and retractable base. In use, the resistor is manually loaded onto the gripping means and the base is retracted so that the resistor is dipped into the etching tank for a predetermined amount of time. After expiration of etching time, the base is extended to lift the resistor out of the etching tank and the extendable arm is extended to place the resistor over the rinse tank. The base is again retracted to dip the resistor into the rinse tank. This sequence of operations continues through the drying and measuring steps. If, after measuring, the value of the resistor is not at the desired level, the extendable arm may be retracted and the resistor may be cycled through the adjust process until its final value is reasonably approximated.

Control of the extendable arm and the base may be achieved manually, or automatically by connection to a control means. The control means which may be a computer or the like, is connected to the measuring apparatus to sense the measured value of the etched resistor, and to the base and the extendable arm. If the sensed value is not close to a value preset into the control means, the control means automatically recycles the resistor through the adjusting process. No explanation of the details of the control means is believed necessary since it is well within the current knowledge of one having reasonable skill in the art of automatic controls.

After the coarse adjust process, the resistor is coated with a plating resist material, such as Nazdar 205, except for the area comprising the terminal lands. The terminal lands 16 are then electroplated with copper, gold or nickel gold, in order to be capable of forming a good solder joint with the connecting leads 18, to be described hereinafter. Any particular plating process may be used which will effectively coat the terminal lands 16. After plating, the plating resist is removed from the resistor circuit pattern by conventional means or other suitable means.

Figure 2:
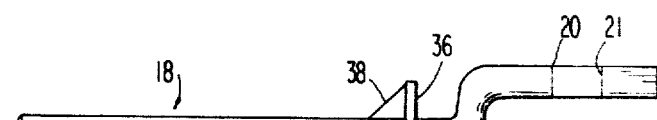
FIGS. 2 and 3 are enlarged side and top views, respectively, of one form of the connecting leads according to the invention.
Figure 3:
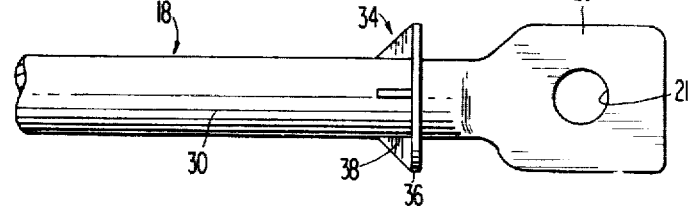

The terminal lands 16 are tinned and the connecting leads are soldered to each end of the circuit path, as shown in FIG. 1. A typical connecting lead 18 is shown in detail in FIGS. 2 and 3. The lead comprises a generally cylindrical portion 30 and an offset, flattened portion 20 having a hole 21 formed in it. Offset flattened portion 20 is soldered to the terminal lands 16 as shown in FIG. 1 and solder 23 passes into and solidifies in the hole 21 and bonds to the walls of said hole. Optionally, talon head 34 is attached to, or integrally formed on, the connecting lead 18 near the flattened portion or paddle 20 and comprises radially extending portion 36 and a plurality of longitudinal ribs 38. The talon heads 34 are surrounded by the molded coating or encapsulating compound (to be described hereinafter) applied to the completed resistor and prevent twisting of the leads about their axes with subsequent weakening of the soldered connections to the terminal lands 16. It is also within the scope of this invention to omit the talon heads 34 and use only the connecting leads as shown in FIG. 1.

Figure 4:
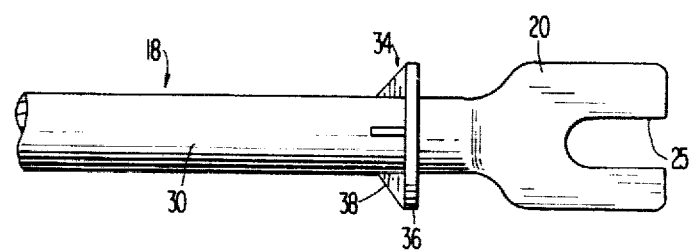
FIGS. 4 and 5 are enlarged side views, respectively, of two alternative forms of the connecting leads pursuant to this invention.
Figure 5:
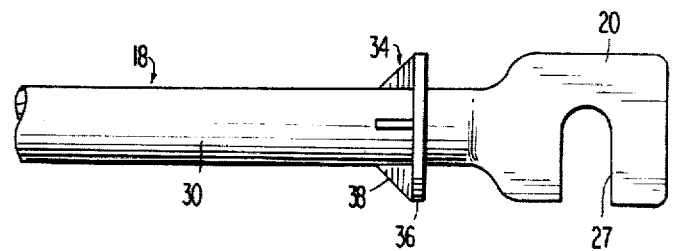

Alternate forms of leads are shown in FIGS. 4 and 5 wherein slots 25 and 27, respectively, are formed in the paddles 20 of the leads 18 so as to form a fork-like paddle 20. When leads of these types are soldered to the lands 16, the solder enters and solidifies in the slots 25 and 27 as the case may be and bonds to the walls of said slots.

After the connecting leads 18 are soldered to the terminal lands 16, the flux is cleaned from the solder joints. The resistor is then ready for fine adjustment to its final value. This is accomplished by cutting a slot 40 (shown in FIG. 1) in a portion of the circuit pattern. The cut alters, i.e., narrows, the path of the current to adjust the resistance value of the circuit. It is envisioned that the cut may be made with extreme accuracy by a laser beam as known by those skilled in the resistor fabricating art.

Subsequent to the final adjustment, the resistor is subjected to an encapsulation treatment. The resistor is fully coated with varnish as previously described. A bead 13 of rubber or other adherent, soft or cushioning material is applied to the substrate 12 along the edge 15 opposite the edge 17 at which leads 18 are connected. The greatest length of the circuit path defined by foil 14 extends between edges 15 and 17 and the compressive stresses exerted from one said edge to the other will have the greatest effect on the resistance value of the resistor. Therefore, the bead 13 of rubber is formed on the edge 15 which is transverse to the direction greatest length of the circuit path of the foil 14. Bead 13 can be a silicone rubber or an RTV rubber such as those described hereinbelow. If desired the bead 13 can be bonded to opposing edges, intersecting edges, three edges or all edges of the substrate 12. Both the varnish and rubber (which may be a silicon rubber such as Sylgard 182 or an RTV) may be applied by dipping the resistor and subsequently rotating it to assure an even coat.

Figure 7:
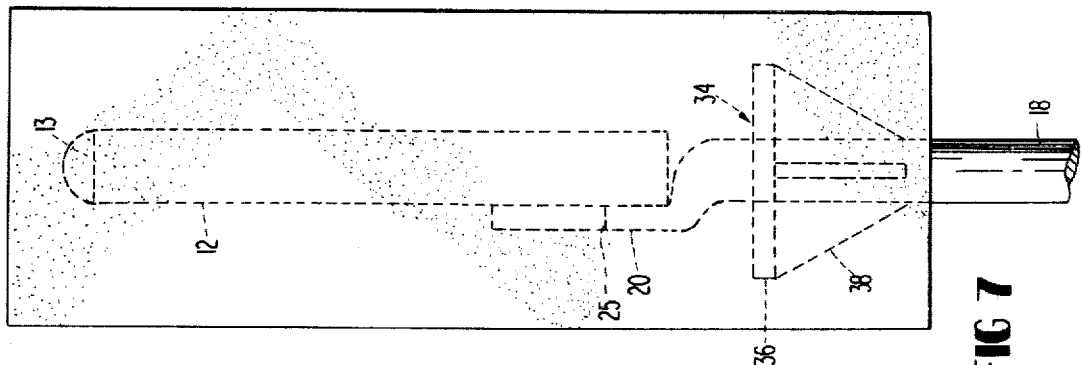
FIGS. 6 and 7 are, respectively, enlarged top and side views of a resistor made according to this invention.
Figure 6:
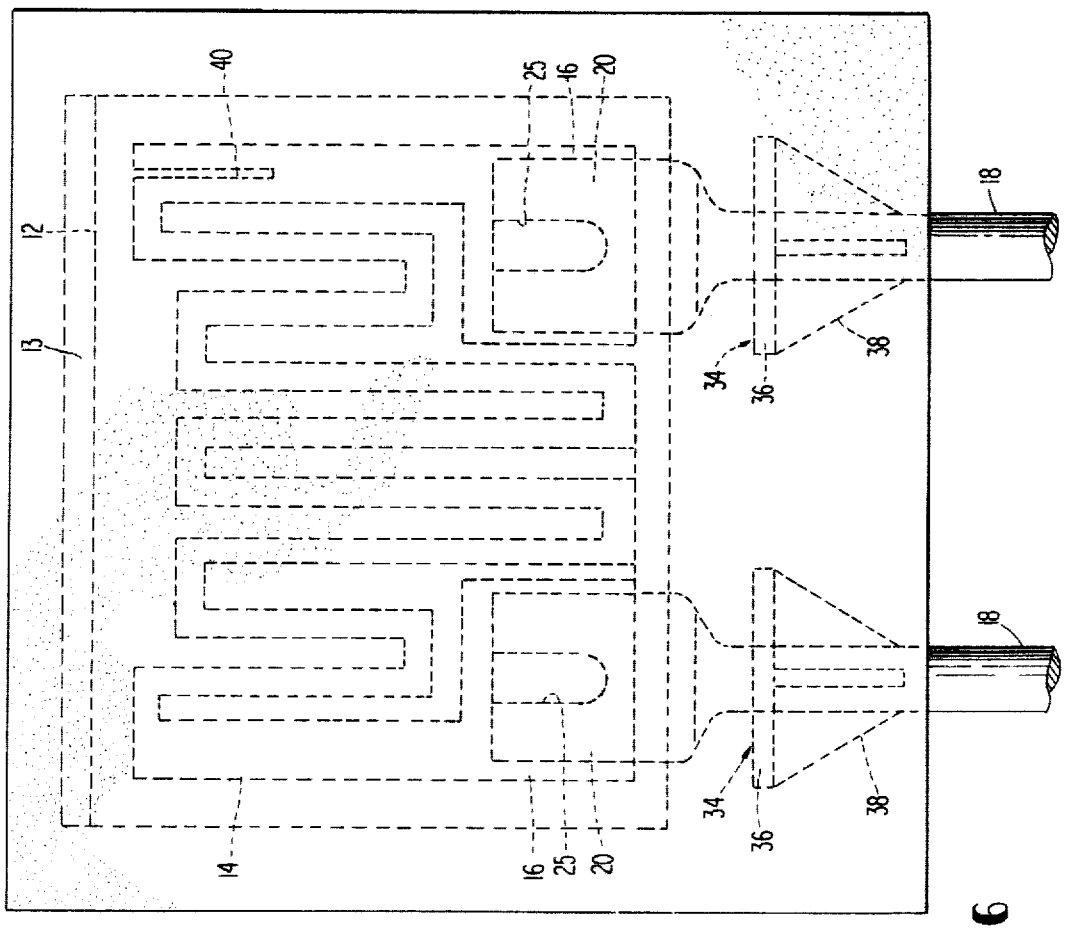

If a translucent varnish is used, it may be applied before the step of laser adjusting the resistor. By applying the varnish prior to the final adjustment, any possible change in resistance which may be caused by the coating is eliminated by the final adjustment. After coating with varnish and rubber, the resistor is placed in a mold and a hard, protective material is molded so as to completely surround the resistor such that only the connecting leads 18 extend from the completed molding. The molding can be accomplished by the standard transfer molding process and need not be described in detail. The mold may be a two piece mold split laterally so that the resistor may be placed therein. The connecting leads, of course, extend through openings in the mold so as to not be completely covered. No special additional means are necessary to position the resistor centrally in the mold, since the leads are sufficiently strong to achieve this purpose. The molded resistor is shown in FIGS. 6 and 7 with the substrate 12, foil circuit 14, and connecting leads 18 shown in dotted lines. Other methods of encapsulation, such as potting in a pre-formed case, known in the art, may also be used without exceeding the scope of this invention.

The thickness of bead 13 is not narrowly critical; it can be more or less than or the same as the thickness of the substrate, e.g., said bead can be 0.1 to 150 mils, preferably 1 to 100 mils thick and can extend from the substrate edge by a matter of 1 to 100 mils. The effects of utilizing the bead 13 as described herein are quite startling in that, in the case of resistors, the variation in resistance value was reduced by using the bead 13 as described herein to less than one fourth the variation incurred in resistors having no bead 13. For example, the offset with the bead 13 was only 0.004% whereas without the bead 13 it was 0.017%.

What is claimed is:

1. In an electrical device to be encapsulated in a hard insulative material, the improvement comprising:
   a thin substantially rigid substrate of electrically nonconductive material having at least one flat surface, said substrate having at least one longitudinally extending marginal edge surface;
   an electrical circuit of conductive foil material bonded to said flat surface, an electrical value of said circuit being variable in response to components of compressive force exerted on said substrate in a direction parallel with the plane of said flat surface and normal to said marginal edge surface by the setting of an encapsulating composition;
   a pair of electrical terminals connected to said electrical circuit to provide leads extending to the exterior of the encapsulating composition;

the exposed surfaces of said substrate and conductive foil material being separated from direct contact with an encapsulating material by a layer of material including a moisture-resistant composition of insufficient thickness to absorb compressive forces of an encapsulating material comprising;
- a thin coating of material comprising at least one coating of a protective moisture-resistant composition
- and a relatively thick bead of resilient material extending both above and below the adjacent upper and lower corners of the substrate adhered only along the length of said marginal edge surface to absorb said components of compressive force.

2. The electrical device of claim 1, wherein said conductive foil and flat surface of the substrate are coated with varnish.

3. The electrical device of claim 1, wherein said substrate and conductive foil are coated by dipping in an elastomeric composition, after application of said protective moisture resistant composition.

4. The electrical device of claim 2, wherein said varnish is applied prior to dipping in the elastomeric composition.

5. The electrical device according to any one of claims 1, 2, 3 or 4, wherein said substrate is generally rectangular and said bead of resilient material is applied to one marginal edge surface and is also covered by said elastomeric composition.

6. The electrical device of claim 5, wherein said bead of resilient material is applied to at least two marginal edge surfaces extending generally at right angles to each other.

7. The electrical device of claim 3, wherein said electrical device includes at least one lead which terminates at one end at said electrical circuit in a flat sheet portion provided with an opening therethrough, and the flat sheet portion is electrically and mechanically bonded to the circuit by solder which adheres to the interior surface of said opening.

8. The electrical device of claim 7, wherein said leads are provided with a radially projecting collar and an axially extending rib to be embedded in the encapsulating composition to prevent axial or rotary displacement of said leads.

9. The electrical device of claim 5, wherein said leads terminate at one end at said electrical circuit in a flat sheet portion provided with an opening therethrough, and the flat sheet portion is electrically and mechanically bonded to the circuit by solder which adheres to the interior surface of said opening.

10. The electrical device of claim 9, wherein said leads are provided with a radially projecting collar and an axially extending rib to be embedded in the encapsulating composition to prevent axial or rotary displacement of said leads.

* * * * *